United States Patent
Jung et al.

(10) Patent No.: US 9,450,155 B2
(45) Date of Patent: Sep. 20, 2016

(54) LIGHT EMITTING DEVICE HAVING WAVELENGTH CONVERTING LAYER

(71) Applicant: Seoul Semiconductor Co., Ltd., Ansan-si (KR)

(72) Inventors: Jung Hwa Jung, Ansan-si (KR); Jung Doo Kim, Ansan-si (KR); Seoung Ho Jung, Ansan-si (KR); Min Hye Kim, Ansan-si (KR); Yoo Jin Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/815,404

(22) Filed: Jul. 31, 2015

(65) Prior Publication Data

US 2015/0340347 A1   Nov. 26, 2015

Related U.S. Application Data

(63) Continuation of application No. 13/984,154, filed as application No. PCT/KR2012/000728 on Jan. 31, 2012, now Pat. No. 9,112,121.

(30) Foreign Application Priority Data

Feb. 9, 2011 (KR) .......................... 10-2011-0011298
Dec. 20, 2011 (KR) .......................... 10-2011-0138520

(51) Int. Cl.
*H01L 33/00* (2010.01)
*H01L 33/50* (2010.01)
(Continued)

(52) U.S. Cl.
CPC ............. *H01L 33/50* (2013.01); *H01L 33/486* (2013.01); *H01L 33/62* (2013.01);
(Continued)

(58) Field of Classification Search
USPC .......................................................... 257/98
See application file for complete search history.

(56) References Cited

U.S. PATENT DOCUMENTS

| 6,155,699 A | 12/2000 | Miller et al. | |
| 7,256,468 B2 * | 8/2007 | Suenaga | H01L 24/49 257/434 |

(Continued)

FOREIGN PATENT DOCUMENTS

| CN | 1945867 | 4/2007 |
| CN | 101009351 | 8/2007 |

(Continued)

OTHER PUBLICATIONS

International Search Report issued on Aug. 22, 2012 in International Application No. PCT/KR2012/000728.

(Continued)

*Primary Examiner* — Telly Green
(74) *Attorney, Agent, or Firm* — H.C. Park & Associates, PLC

(57) ABSTRACT

Disclosed is a light emitting device having a wavelength converting layer. The light emitting device comprises a plurality of semiconductor stacked structures; connectors for electrically connecting the plurality of semiconductor stacked structures to one another; a single wavelength converting layer for covering the plurality of semiconductor stacked structures; an electrode electrically connected to at least one of the semiconductor stacked structures; and at least one additional electrode positioned on the electrode, passing through the wavelength converting layer to be exposed to the outside, and forming a current input terminal to the light emitting device or a current output terminal from the light emitting device. Since the single wavelength converting layer covers the plurality of semiconductor stacked structures, the plurality of semiconductor stacked structures can be integrally mounted on a chip mounting member such as a package or a module.

13 Claims, 8 Drawing Sheets

(51) Int. Cl.
 *H01L 33/48* (2010.01)
 *H01L 33/62* (2010.01)
 H01L 33/46 (2010.01)
 H01L 25/075 (2006.01)

(52) U.S. Cl.
 CPC .......... *H01L 25/0753* (2013.01); *H01L 33/46* (2013.01); *H01L 33/505* (2013.01); *H01L 33/508* (2013.01); *H01L 2224/48091* (2013.01); *H01L 2924/181* (2013.01)

(56) References Cited

U.S. PATENT DOCUMENTS

| | | | |
|---|---|---|---|
| 8,035,120 | B2 | 10/2011 | Ito et al. |
| 8,283,682 | B2 | 10/2012 | Yoon et al. |
| 8,390,021 | B2 * | 3/2013 | Nagai .................... H01L 27/156 257/99 |
| 8,664,635 | B2 | 3/2014 | Jung et al. |
| 2001/0024460 | A1 | 9/2001 | Yamamoto et al. |
| 2005/0194601 | A1 * | 9/2005 | Suenaga ................ H01L 24/49 257/81 |
| 2008/0173884 | A1 | 7/2008 | Chitnis et al. |
| 2008/0179611 | A1 | 7/2008 | Chitnis et al. |
| 2009/0008654 | A1 | 1/2009 | Nagai |
| 2009/0065790 | A1 | 3/2009 | Chitnis et al. |
| 2009/0159915 | A1 | 6/2009 | Branchevsky |
| 2009/0261358 | A1 | 10/2009 | Chitnis et al. |
| 2010/0105156 | A1 | 4/2010 | Chen et al. |
| 2011/0266579 | A1 * | 11/2011 | Nagai .................... H01L 27/156 257/98 |
| 2011/0284822 | A1 | 11/2011 | Jung et al. |
| 2011/0284884 | A1 | 11/2011 | Lee et al. |
| 2014/0151633 | A1 | 6/2014 | Jung et al. |

FOREIGN PATENT DOCUMENTS

| | | | |
|---|---|---|---|
| CN | 101271915 | 9/2008 | |
| CN | 103003966 | 3/2013 | |
| EP | 2388838 | 11/2011 | |
| JP | 2009-239116 | 10/2009 | |
| JP | WO 2010146783 A1 * | 12/2010 | ........... H01L 27/156 |
| KR | 10-2006-0095271 | 8/2006 | |
| KR | 10-2009-0039932 | 4/2009 | |
| KR | 10-2011-0011171 | 2/2011 | |

OTHER PUBLICATIONS

Written Opinion issued on Aug. 22, 2012 in International Application No. PCT/KR2012/000728.
Non Final Office Action issued on Jul. 3, 2014, in U.S. Appl. No. 13/984,154.
Final Office Action issued on Dec. 31, 2014, in U.S. Appl. No. 13/984,154.
Notice of Allowance issued on Apr. 8, 2015, in U.S. Appl. No. 13/984,154.
European Search Report issued on Feb. 24, 2016, in European Patent Application No. 12744986.
European Search Report issued on May 20, 2016, in European Patent Application No. 12744986.

* cited by examiner

LIGHT EMITTING DEVICE HAVING WAVELENGTH CONVERTING LAYER

CROSS-REFERENCE TO RELATED APPLICATIONS

This application is a Continuation of U.S. patent application Ser. No. 13/984,154, filed on Aug. 7, 2013, now issued as U.S. Pat. No. 9,112,121, which is the National Stage entry of International Application PCT/KR2012/000728, filed on Jan. 31, 2012, and claims priority from and the benefit of Korean Patent Application Nos. 10-2011-0011298, filed on Feb. 9, 2011, and 10-2011-0138520, filed on Dec. 20, 2011, which are incorporated herein by reference for all purposes as if fully set forth herein.

BACKGROUND

1. Field

The present invention relates to a light emitting device, and more particularly, to a light emitting device having a wavelength converting layer.

2. Discussion of the Background

Current light emitting diodes (LEDs) can be made to be light in weight, thin in thickness and small in size, and have advantages of energy reduction and long lifetime. Accordingly, the LEDs are used as backlight sources for various types of display devices including cellular phones, and the like. Since an LED package having an LED mounted therein can implement white light having a high color rendering property, it is expected that the LED package will be applied to general illumination while substituting for white light sources such as fluorescent lamps.

Meanwhile, there are various methods of implementing white light using LEDs. Among others, a method is generally used in which white light is implemented by combining an InGaN LED that emits blue light of 430 to 470 nm and a phosphor that can convert the blue light into light with a long wavelength. For example, the white light may be implemented by combining a blue LED and a yellow phosphor excited by the blue LED so as to emit yellow light or by combining a blue LED and green and red phosphors.

Conventionally, white LED packages have been formed by encapsulating an LED chip with a resin containing a phosphor at a package level. However, the phosphor is not uniformly distributed in the resin, and it is difficult to form the resin with a uniform thickness.

Accordingly, studies have been conducted to develop a technique for providing an individual LED chip having a wavelength converting layer with a uniform thickness by forming a uniform phosphor layer at a wafer level or a chip level. The LED chip having the wavelength converting layer with a uniform thickness is provided at the wafer level or the chip level, so that a process of forming the wavelength converting layer can be omitted at a package level. Further, since the wavelength converting layer with the uniform thickness is used, it is possible to prevent color variations which could be generated due to orientation angles.

However, in the technique as described above, the individual LED chip has the wavelength converting layer, so that, when a plurality of LED chips are required, for example, in a high-power LED package, each of the LED chips should be individually mounted and subjected to wire bonding at the package level. Therefore, there is a limitation in simplifying a packaging process. Further, since a plurality of LED chips should be mounted, the size of the package is increased, and it is difficult to provide a light source which may be considered as a point light source.

SUMMARY

Accordingly, the present invention is conceived to solve the aforementioned problems. An object of the present invention is to provide a light emitting device having a wavelength converting layer, which can simplify a mounting process and/or a wire bonding process of a plurality of chips, performed at a package level or a module level, and decrease the size of a light source.

Another object of the present invention is to provide a light emitting device capable of preventing light converted in a wavelength converting layer from being again incident into the inside of an LED chip to be resultantly lost.

Still another object of the present invention is to provide a light emitting device capable of reducing the damage of a wavelength converting layer by light.

According to an aspect of the present invention, there is provided a light emitting device having a wavelength converting layer, comprising: a plurality of semiconductor stacked structures electrically connected to one another; a wavelength converting layer for covering the plurality of semiconductor stacked structures; an electrode electrically connected to at least one of the semiconductor stacked structures; and at least one additional electrode positioned on the electrode and passing through the wavelength converting layer to be exposed to the outside. Since the plurality of semiconductor stacked structures are electrically connected to one another, the additional electrode passing through the wavelength converting layer can be disposed only at a current input terminal and/or a current output terminal, so that it is possible to simplify a wire bonding process at a package level or a module level.

The plurality of semiconductor stacked structures may be electrically connected to one another by means of connectors. The wavelength converting layer may cover the connectors. For example, a single wavelength converting layer may cover the plurality of semiconductor stacked structures. Since the single wavelength converting layer covers the plurality of semiconductor stacked structures, the plurality of semiconductor stacked structures can be integrally mounted on a chip mounting member such as a package or a module.

The additional electrode may comprise a first additional electrode through which current is outputted from the light emitting device, and a second additional electrode through which current is inputted to the light emitting device. Further, the light emitting device may have a plurality of first additional electrodes and a plurality of second additional electrodes, or may have a single first additional electrode and a single second additional electrode.

At least one of the plurality of semiconductor stacked structures comprise a plurality of light emitting cells, and the plurality of light emitting cells may be electrically connected to one another by wires.

In some embodiments, the wavelength converting layer may maintain a spatial relation between the plurality of semiconductor stacked structures. That is, a support substrate for supporting the entire of the plurality of semiconductor stacked structures may not separately exist, and only the wavelength converting layer may combine the plurality of semiconductor stacked structure.

In other embodiments, the support substrate may maintain a spatial relation between the plurality of semiconductor stacked structures. The wavelength converting layer may cover the plurality of semiconductor stacked structures on the support substrate.

The plurality of semiconductor stacked structures may comprise a first semiconductor stacked structure for emitting light of a first wavelength, and a second semiconductor stacked structure for emitting light of a second wavelength longer than the first wavelength.

The light emitting device may comprise a plurality of LED chips. Here, the respective LED chips may comprise a substrate and the semiconductor stacked structures positioned on the substrate. The plurality of LED chips may emit light of the same wavelength, but the present invention is not limited thereto. The plurality of LED chips may comprise LED chips for emitting light of different wavelengths, respectively. Further, at least one of the plurality of LED chips may have a plurality of light emitting cells.

The connectors are not particularly limited, but may comprise bonding wires. The additional electrode may be formed using a ball bonding process of the wires. In this case, the bonding wires may be formed together with the additional electrode in the same process.

In some embodiments, the plurality of LED chips may be arranged on the support substrate so as to be supported by the support substrate. The light emitting device may further comprise a bonding pattern formed on the support substrate. A wire may be bonded to the bonding pattern. Thus, the plurality of LED chips can be easily connected to one another using the bonding wires with the help of the bonding pattern.

The light emitting device may further comprise a spacer layer interposed between the wavelength converting layer and the at least one of the semiconductor stacked structures. The spacer layer is formed of an insulating layer. The spacer layer may comprise a distributed Bragg reflector (DBR), and may further comprise a stress relief layer interposed between the DBR and the semiconductor stacked structure.

The spacer layer is interposed between the wavelength converting layer and the semiconductor stacked structure so that the wavelength converting layer is spaced apart from the semiconductor stacked structure. The spacer layer prevents the yellowing of a phosphor in the wavelength converting layer, which might be caused by light emitted from the semiconductor stacked structure.

The DBR may be formed by alternately laminating insulating layers with different refractive indices, e.g., $SiO_2/TiO_2$ or $SiO_2/Nb_2O_5$. By adjusting the optical thicknesses of the insulating layers with different refractive indices, the DBR may be configured to transmit light generated in an active layer and reflect light converted in the wavelength converting layer.

The stress relief layer relieves a stress which might be caused in the DBR, so that it is possible to prevent the DBR from being exfoliated from a layer formed under the DBR, e.g., the semiconductor stacked structure. The stress relief layer may be formed of spin-on-glass (SOG) or porous silicon oxide.

The additional electrode may have a width narrower than that of the electrode. The width of the additional electrode may become narrower as the additional electrode is further apart from the electrode. Accordingly, the additional electrode can be stably attached to the electrode, and it is possible to ensure the reliability of a subsequent process of bonding wires.

According to another aspect of the present invention, there is provided a light emitting device comprising: a support substrate having first and second lead electrodes; a plurality of LED chips mounted on the support substrate; and a single wavelength converting layer for covering the plurality of LED chips. Here, the first and second lead electrodes pass through the support substrate to extend to a bottom of the support substrate.

Accordingly, since the light emitting device is connected to an external power source using the first and second lead electrodes, the additional electrode can be omitted.

In some embodiments, the plurality of LED chips may comprise a first LED chip for emitting light of a first wavelength, and a second LED chip for emitting light of a second wavelength longer than the first wavelength.

Although the plurality of LED chips may be connected to one another in series between the first and second lead electrodes, the present invention is not limited thereto, and the plurality of LED chips may be connected to one another in various manners. The plurality of LED chips may be electrically connected to one another by means of bonding wires. Alternatively, the LED chips are flip-bonded onto the support substrate so as to be electrically connected to one another.

According to still another aspect of the present invention, there are provided a light emitting module and a lighting assembly. The light emitting module may comprise the light emitting device as described above and a printed circuit board on which the light emitting device is mounted. The lighting assembly may comprise the light emitting module.

According to the present invention, since a plurality of semiconductor stacked structures are electrically connected to one another, an additional electrode passing through a wavelength converting layer is disposed only at a current input terminal and/or a current output terminal, or lead electrodes passing through a support substrate is employed, so that it is possible to simplify a wire bonding process at a package level or a module level. Further, since the plurality of semiconductor stacked structures are covered using the single wavelength converting layer, the plurality of semiconductor stacked structures can be integrally mounted on a chip mounting member such as a package or a module. Further, a spacer layer is employed, so that it is possible to prevent a phosphor in the wavelength converting layer from being damaged by light emitted from the semiconductor stacked structure. Further, the spacer layer comprises a DBR, so that it is possible to prevent light converted in the wavelength converting layer from being again incident into the inside of the semiconductor stacked structure, thereby improving light efficiency.

DETAILED DESCRIPTION OF THE ILLUSTRATED EMBODIMENTS

Figure 1:
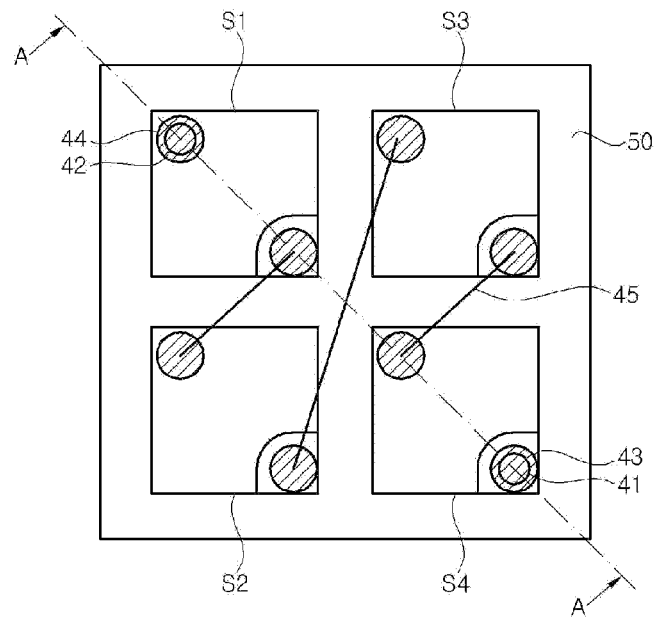
FIG. 1 is a schematic plan view illustrating a light emitting device according to an embodiment of the present invention.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements are exaggerated for convenience of illustration. Like reference numerals indicate like elements throughout the specification and drawings.

Figure 2:
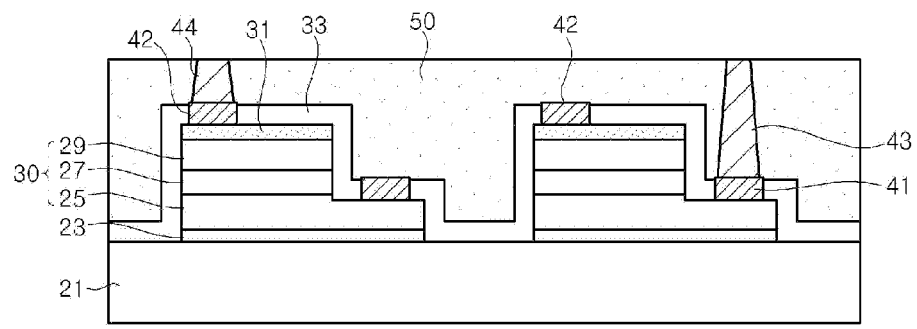
FIG. 2 is a sectional view taken along line A-A of FIG. 1, illustrating the light emitting device according to the embodiment of the present invention.

FIG. 1 is a schematic plan view illustrating a light emitting device according to an embodiment of the present invention. FIG. 2 is a sectional view taken along line A-A of FIG. 1, illustrating the light emitting device according to the embodiment of the present invention.

Referring to FIGS. 1 and 2, the light emitting device includes a substrate 21, a plurality of semiconductor stacked structures S1, S2, S3 and S4, first electrodes 41, second electrodes 42, a first additional electrode 43, a second additional electrode 44, connectors 45 for electrically connecting the plurality of semiconductor stacked structures to one another, and a wavelength converting layer 50. The respective semiconductor stacked structures S1, S2, S3 and S4 is formed of a plurality of GaN-based semiconductor stacked structures 30 including a first conductive-type semiconductor layer 25, an active layer 27 and a second conductive-type semiconductor layer 29. A buffer layer 23 may be interposed between the first conductive-type semiconductor layer 25 and the substrate 21, and a spacer layer 33 may be interposed between the wavelength converting layer 50 and each of the semiconductor stacked structures 30.

The substrate 21 is not particularly limited, and may be a substrate capable of growing nitride semiconductor layers thereon, e.g., a sapphire substrate, a silicon carbide substrate, a spinel substrate, a silicon substrate, or the like. The substrate 21 may be relatively thicker than the semiconductor stacked structure.

The active layer 27 and the first and second conductive-type semiconductor layers 25 and 29 may be formed of a III-N-based compound semiconductor, e.g., an (Al, Ga, In)N semiconductor. Each of the first and second conductive-type semiconductor layers 25 and 29 may have a single- or multi-layered structure. For example, the first conductive-type semiconductor layer 25 and/or the second conductive-type semiconductor layer 29 may comprise a contact layer and a clad layer, and may further comprise a superlattice layer. In addition, the active layer 27 may have a single or multiple quantum well structure. For example, the first and second conductive-type semiconductor layers may be n-type and p-type semiconductor layers, respectively, but the present invention is not limited thereto. That is, the first and second conductive-type semiconductor layers may be p-type and n-type semiconductor layers, respectively. The buffer layer 23 decreases the defect density generated in the semiconductor layers 25, 27 and 29 by reducing the lattice mismatch between the substrate 21 and the first conductive-type semiconductor layer 25.

Meanwhile, the first electrode 41 is electrically connected to the first conductive-type semiconductor layer 25 by coming in contact with an exposed surface of the first conductive-type semiconductor layer 25. The second electrode 42 may be positioned on a top of the second conductive-type semiconductor layer 29 so as to be electrically connected to the second conductive-type semiconductor layer 29. The first and second electrodes 41 and 42 may be formed on each of the semiconductor stacked structures S1, S2, S3 and S4. The first and second electrodes 41 and 42 may comprise, for example, Ti, Cu, Ni, Al, Au or Cr, and may be formed of two or more materials thereof. A transparent conductive layer 31 such as Ni/Au, ITO, IZO or ZnO may be formed on the second conductive-type semiconductor layer 29 for the purpose of current distribution, and second electrode 42 may be connected to the transparent conductive layer.

The first additional electrode 43 forms a current output terminal of the light emitting device, and is positioned on the first electrode 41 of the semiconductor stacked structure S4. The second additional electrode 44 forms a current input terminal of the light emitting device, and is positioned on the second electrode 42 of the semiconductor stacked structure S1. Since the first and second additional electrodes form the current output terminal and the current input terminal, respectively, the light emitting device may have only the two additional electrodes. The first and second additional electrodes 43 and 44 may have widths narrower than those of the first and second electrodes 41 and 42, respectively. That is, the first and second additional electrodes are confined to tops of the first and second electrodes, respectively. The first and second additional electrodes 43 and 44 may have shapes in which the widths of the first and second additional electrodes become narrower as the first and second additional electrodes are further apart from the first and second electrodes 41 and 42, respectively. Accordingly, the shapes as described above may cause the first and second additional electrodes 43 and 44 to be stably attached and maintained to the respective first and second electrodes 41 and 42, which may be advantageous in a subsequent process such as a wire bonding process.

The connectors 45 electrically connect the semiconductor stacked structures S1, S2, S3 and S4 to one another. As shown in FIG. 1, the semiconductor stacked structures may be connected in series by the connectors 45. However, the present invention is not limited thereto, and the semiconductor stacked structures S1, S2, S3 and S4 may be electrically connected in various manners including in series, in parallel, in series-parallel, in reverse parallel, and the like.

The connectors 45 may be particularly bonding wires, and may be formed together with the first and second additional electrodes 43 and 44 using a wire bonding process. Since the semiconductor stacked structures S1, S2, S3 and S4 are arranged on the substrate 21 with a high degree of precision, the wire bonding process can be very precisely performed.

The single wavelength converting layer 50 may cover sides and tops of the plurality of semiconductor stacked structures 30. The wavelength converting layer 50 may also cover the connectors 45 such as bonding wires.

The single wavelength converting layer 50 may be formed of a phosphor contained in epoxy or silicon, or may be formed only of a phosphor. For example, before a chip is partitioned at a wafer level, the wavelength converting layer 50 may be formed of resin, e.g., epoxy or silicon, containing a phosphor therein so to have a uniform thickness using squeezing. At this time, the resin covering the first and second additional electrodes 43 and 44 is removed using grinding or the like, so that top surfaces of the first and second additional electrodes 43 and 44 can be exposed. Accordingly, the wavelength converting layer 50 having a flat top surface can be formed, and the first and second additional electrodes 43 and 44 pass through the wavelength converting layer 50 to be exposed to the outside of the light emitting device.

Further, the wavelength converting layer 50 may have a refractive index, for example, within a range from 1.4 to 2.0, and powder made of TiO2, SiO2, Y2O3 or the like may be mixed in the wavelength converting layer 50 so as to control the refractive index.

Although not particularly limited, the top surface of the first additional electrode 43 may be positioned at a height identical to that of the second additional electrode 44. Therefore, when portions of the second conductive-type semiconductor layer 29 and the active layer 27 are removed to expose the first conductive-type semiconductor layer 25, the first additional electrode 43 may be longer than the second additional electrode 44, as shown in FIG. 2.

The spacer layer 33 is interposed between each of the semiconductor stacked structures 30 and the wavelength converting layer 50 so that the wavelength converting layer 50 is spaced apart from the semiconductor stacked structure 30. The spacer layer 33 may cover tops of the semiconductor stacked structure 30 and the transparent conductive layer 31. The spacer layer 33 may be formed of, for example, transparent resin, silicon nitride or silicon oxide. As the wavelength converting layer 50 is spaced apart from the semiconductor stacked structure 30 by the spacer layer 33, it is possible to prevent the yellowing of the wavelength converting layer 50.

According to this embodiment, the second additional electrode 44 of the semiconductor stacked structure S1 forms a current input terminal so that current can be inputted from the outside to the light emitting device through the current input terminal, and the first additional electrode 43 of the semiconductor stacked structure S4 forms a current output terminal so that current can be outputted from the light emitting device to the outside through the current output terminal. Meanwhile, current is inputted/outputted to/from the semiconductor stacked structures S2 and S3 by means of the connectors 45. Thus, the semiconductor stacked structures S2 and S3 can be fully buried in the wavelength converting layer 50, so that additional electrodes need not be added on the semiconductor stacked structures S2 and S3.

Similarly to the conventional method of fabricating an LED, the light emitting device according to this embodiment may be fabricated using the semiconductor stacked structures 30 formed on the substrate 21 with a size ranging from 2 to 6 inches, which is used as a growth substrate. The electrodes 41 and 42 are formed on the semiconductor stacked structures, the additional electrodes 43 and 44 are formed on the semiconductor stacked structures S1 and S4 specified for each selected unit, and the connectors electrically connecting the semiconductor stacked structures to one another are formed. Then, the wavelength converting layer 50 is formed over the substrate 21 at the wafer level, and an upper portion of the wavelength converting layer 50 is removed through mechanical polishing such as grinding to expose the additional electrodes 43 and 44. Subsequently, the substrate 21 is partitioned for each selected unit, thereby completing the light emitting device. In addition, the spacer layer 33 may be previously formed at the wafer level before the wavelength converting layer 50 is formed.

According to this embodiment, the semiconductor stacked structures 30 respectively corresponding to a plurality of chip regions may be integrally mounted on a package, a module or the like. Since the semiconductor stacked structures 30 are electrically connected to one another by the connectors 45, the number of bonding wires required in a package process or a module process can be remarkably decreased, thereby simplifying a wire bonding process.

Figure 3:
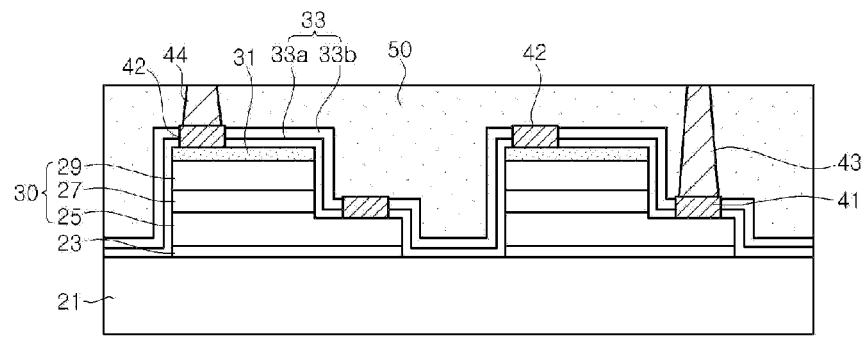
FIG. 3 is a sectional view illustrating a light emitting device according to another embodiment of the present invention.

FIG. 3 is a sectional view illustrating a light emitting device according to another embodiment of the present invention.

Referring to FIG. 3, the light emitting device according to this embodiment is almost similar to that described with reference to FIGS. 1 and 2, but different in that the spacer layer 33 comprises a distributed Bragg reflector (DBR) 33b. The spacer layer 33 may further comprise a stress relief layer 33a interposed between the DBR 33b and the semiconductor stacked structure 30.

That is, the spacer layer 33 may comprise the DBR 33b formed by alternately laminating insulating layers with different refractive indices, e.g., SiO2/TiO2 or SiO2/Nb2O5. In this case, the optical thicknesses of the insulating layers with the different refractive indices are adjusted, so that the spacer layer 33 can transmit light generated in the active layer 27 and reflect light incident from the outside or converted in the wavelength converting layer 50. The DBR has a reflection band in which light having a long-wavelength region in the visible light region is reflected while short-wavelength visible light or ultraviolet light generated in the active layer 27 is transmitted.

According to this embodiment, the spacer layer 33 comprises the DBR 33*b*, so that it is possible to prevent light converted in the wavelength converting layer 50 from being again incident into the semiconductor stacked structure 30.

Meanwhile, the stress relief layer 33*a* may be formed of spin-on-glass (SOG) or porous silicon oxide. The stress relief layer 33*a* prevents the exfoliation of the DBR 33*b* by relieving a stress of the DBR 33*b*.

When the DBR 33*b* is formed by alternately laminating insulating layers with different refractive indices, e.g., SiO2/TiO2 or SiO2/Nb2O5, relatively high-density layers are laminated, so that the stress generated in the DBR is increased. Accordingly, the DBR may be easily exfoliated from the semiconductor stacked structure 30. Thus, the stress relief layer 33*a* is disposed under the DBR 33*b*, so that it is possible to prevent the exfoliation of the DBR 33*b*.

Figure 4:
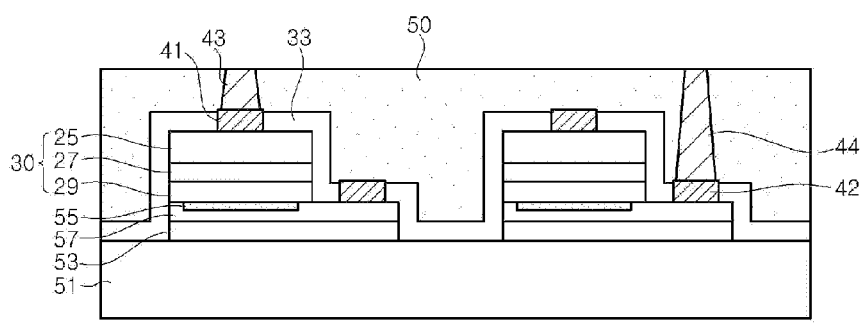
FIG. 4 is a sectional view illustrating a light emitting device according to still another embodiment of the present invention.

FIG. 4 is a sectional view illustrating a light emitting device according to still another embodiment of the present invention.

Although the semiconductor stacked structures 30 having a horizontal structure have been exemplarily described in FIGS. 1 to 3, the semiconductor stacked structures 30 in this embodiment have a vertical structure as shown in FIG. 4. The light emitting device according to this embodiment comprises a substrate 51, a plurality of semiconductor stacked structures 30 each having a first conductive-type semiconductor layer 25, an active layer 27 and a second conductive-type semiconductor layer 29, first electrodes 41, a first additional electrode 43 and a wavelength converting layer 50. Further, the light emitting device may comprise a spacer layer 33, and may also comprise second electrodes 42, a second additional electrode 44, reflective metal layers 55, barrier metal layers 57 and bonding metals 53.

The substrate 51 is distinguished from a growth substrate for growing the semiconductor layers 25, 27 and 29 thereon, and is a secondary substrate attached to the previously grown compound semiconductor layers 25, 27 and 29. The substrate 51 may be a conductive substrate, for example, a metal substrate or a semiconductor substrate, but may be an insulation substrate such as sapphire so that the plurality of semiconductor stacked structures 30 can be connected to one another in series.

The plurality of semiconductor stacked structures 30 are positioned on the substrate 51, and each semiconductor stacked structure 30 has the first conductive-type semiconductor layer 25, the active layer 27 and the second conductive-type semiconductor layer 29. Here, like a general vertical LED, the p-type compound semiconductor layer 29 in the semiconductor stacked structure 30 is positioned closer to the substrate 51 than the n-type compound semiconductor layer 25.

The first conductive-type semiconductor layer 25, the active layer 27 and the second conductive-type semiconductor layer 29 are similar to the semiconductor layers described with reference to FIG. 2, so that their detailed descriptions will be omitted. Meanwhile, the n-type compound semiconductor layer 25 having a relatively small resistance is positioned at the opposite side of the substrate 51, so that a top surface of the n-type compound semiconductor layer 25 may be formed to be roughened.

The reflective metal layer 55 may be interposed between the substrate 51 and each of the semiconductor stacked structures 30, and the barrier metal layer 57 may be interposed between the substrate 51 and the reflective metal layer 55 so as to surround the reflective metal layer 55. Further, the substrate 51 may be bonded to the semiconductor stacked structure 30 via the bonding metal 53. The reflective metal layer 55 and the barrier metal layer 57 may serve as a second electrode electrically connected to the second conductive-type semiconductor layer 29. In addition, the second electrode 42 may be additionally formed on the barrier metal layer 57.

The wavelength converting layer 50 covers tops of the plurality of semiconductor stacked structures 30 on the substrate 51. The wavelength converting layer 50 may cover sides and tops of the semiconductor stacked structures 30.

Meanwhile, the spacer layer 33 may be interposed between the wavelength converting layer 50 and the semiconductor stacked structure 30. The spacer layer 33 may be formed of, for example, transparent resin, silicon nitride or silicon oxide, as described with reference to FIG. 2. Further, as described with reference to FIG. 3, the spacer layer 33 may comprise a DBR 33*b*, and may comprise a stress relief layer 33*a*.

The first electrodes 41 are positioned on the respective semiconductor stacked structures 30, e.g., the respective first conductive-type semiconductor layers 25, so as to be electrically connected to the respective first conductive-type semiconductor layers 25, and the first additional electrode 43 is positioned on the first electrode 41. The second additional electrode 44 may be positioned on the second electrode 42. The additional electrodes 43 and 44 may have the same shapes and structures as the first and second additional electrodes 43 and 44 described with reference to FIG. 1. The first and second additional electrodes 43 and 44 are exposed to the outside of the light emitting device through the wavelength converting layer 50.

In this embodiment, the first and second additional electrodes 43 and 44, as described with reference to FIGS. 1 and 2, may form a current output terminal from the light emitting device and a current input terminal to the light emitting device, respectively. The light emitting device according to this embodiment may comprise a plurality of semiconductor stacked structures S1, S2, S3 and S4 as shown in FIG. 1, and the adjacent semiconductor stacked structures 30 may be electrically connected to one another by means of connectors 45, e.g., bonding wires.

Meanwhile, although it has been illustrated and described in this embodiment that the first and second electrodes 41 and 42 are connected to the respective semiconductor stacked structures 30, the first additional electrode 43 is formed on the first electrode 41 of one semiconductor stacked structure 30, and the second additional electrode 44 is formed on the second electrode 42 of another semiconductor stacked structure 30, the present invention is not limited thereto. For example, when the substrate 51 is a conductive substrate, the second electrode 42 and the second additional electrode 44 may be omitted, and the substrate 51 may form a current input terminal. In this case, one first additional electrode 43 may form a current output terminal from the light emitting device, and the semiconductor stacked structures 30 may be connected to one another by means of the connectors so as to be connected in parallel between the substrate and the first additional electrode 43.

Figure 5:
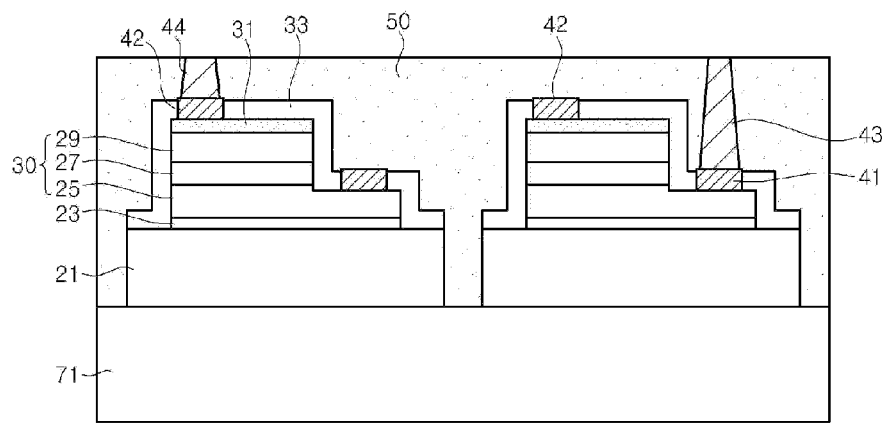
FIG. 5 is a sectional view illustrating a light emitting device according to still another embodiment of the present invention.
Figure 6:
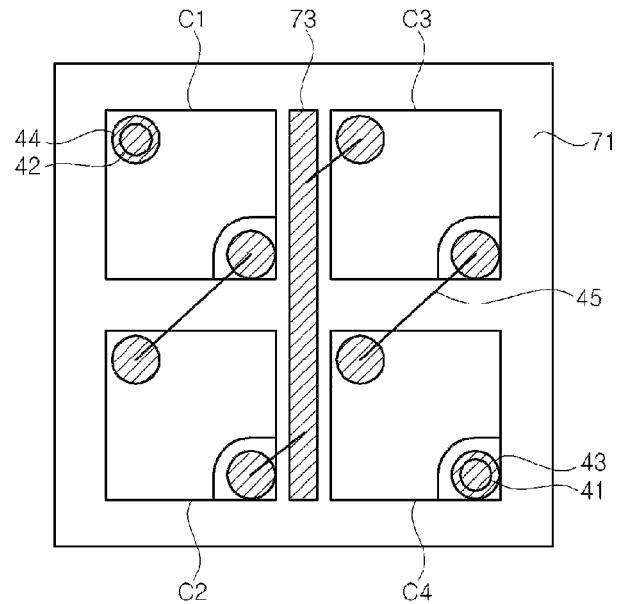
FIG. 6 is a plan view illustrating the light emitting device of FIG. 5.

FIG. 5 is a sectional view illustrating a light emitting device according to still another embodiment of the present invention. FIG. 6 is a plan view illustrating the light emitting device of FIG. 5.

Referring to FIGS. 5 and 6, although the plurality of semiconductor stacked structures 30 are arranged on the substrate 21 in the light emitting device described with reference to FIGS. 1 and 2, the light emitting device according to this embodiment is different from that described with reference to FIGS. 1 and 2 in that a plurality of LED chips are arranged on a support substrate 71.

Each of the LED chips C1, C2, C3 and C4 may comprise a substrate 21, a semiconductor stacked structure 30, a first electrode 41 and a second electrode 42, and may comprise a spacer layer 33. That is, each of the LED chips of this embodiment is obtained by partitioning the light emitting device of FIG. 2 with the wavelength converting layer 50 removed into individual chips corresponding to the single semiconductor stacked structure 30.

As described with reference to FIG. 1, the first additional electrode 43 is positioned on the first electrode 41 of the LED chip C4, and the second additional electrode 44 is positioned on the second electrode 42 of the LED chip 43. The first additional electrode 43 forms a current output terminal from the light emitting device, and the second additional electrode 44 forms a current input terminal to the light emitting device.

Meanwhile, like the light emitting device of FIG. 1, the connectors may electrically connect to the LED chips C1, C2, C3 and C4 to one another. In addition, as shown in FIG. 6, the LED chips C2 and C3 may be electrically connected to one another using a bonding pattern 73 on the support substrate 71. That is, a wire is bonded to the bonding pattern 73, so that it is possible to decrease the length of the wire through which the LED chips C2 and C3 are connected to each other.

The wavelength converting layer 50 covers the LED chips C1, C2, C3 and C4 on the support substrate 71. The wavelength converting layer 50 may cover sides of each substrate 21, and thus wavelength conversion can also be performed on light emitted through the sides of the substrate 21.

The light emitting device according to this embodiment may be fabricated by mounting the individual LED chips C1, C2, C3 and C4 on the support substrate 71, electrically connecting them to one another, forming the wavelength converting layer 50 and then partitioning the wavelength converting layer 50 together with the support substrate 71 for each unit. Meanwhile, the first and second additional electrodes 43 and 44 may be previously formed at the wafer level, but may be formed together with the bonding wires on the support substrate 71.

Figure 7:
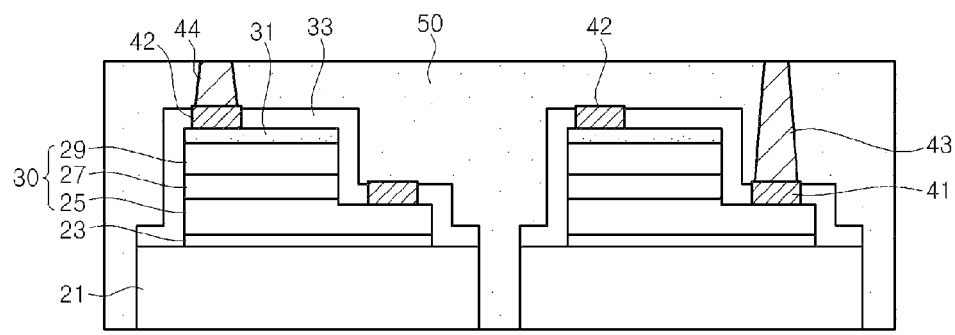
FIG. 7 is a sectional view illustrating a light emitting device according to still another embodiment of the present invention.

FIG. 7 is a sectional view illustrating a light emitting device according to still another embodiment of the present invention.

Referring to FIG. 7, the light emitting device according to this embodiment is almost similar to that of FIG. 6, but different in that the support substrate 71 is removed. The support substrate 71 may be removed after the wavelength converting layer 50 is formed as described in FIG. 6. Then, the light emitting device may be completed by partitioning the wavelength converting layer 50 for each unit. Accordingly, a bottom surface of the substrate 21 in each of the LED chips may be exposed to the outside.

In the embodiment of FIG. 6, the support substrate 71 maintains a spatial relation of the LED chips C1, C2, C3 and C4. However, in this embodiment, the wavelength converting layer 50 maintains a spatial relation of the LED chips.

Meanwhile, in this embodiment, the support substrate 71 is removed, so that the bonding pattern cannot also be used. Thus, the LED chips C1, C2, C3 and C4 are electrically connected to one another by means of connectors such as bonding wires.

Figure 8:
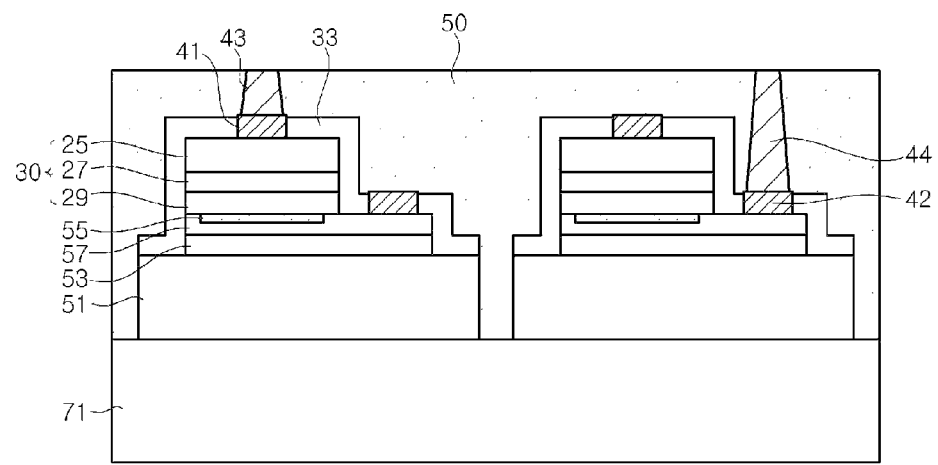
FIG. 8 is a sectional view illustrating a light emitting device according to still another embodiment of the present invention.

FIG. 8 is a sectional view illustrating a light emitting device according to still another embodiment of the present invention.

Referring to FIG. 8, the light emitting device according to this embodiment is almost similar to that described with reference to FIG. 6, but different in that vertical LED chips are arranged on the support substrate 71.

The LED chips may be, for example, obtained by partitioning the light emitting device of FIG. 4 except the wavelength converting layer 50 into individual LED chips. The arrangement of the first and second electrodes and the first and second additional electrodes is similar to that in the light emitting device of FIG. 4, and therefore, its detailed description will be omitted. However, as described with reference to FIG. 6, the bonding pattern 73 may be formed on the support substrate 71, and the bonding pattern 73 may be used so that the semiconductor stacked structures 30 are electrically connected to one another.

The light emitting device may be completed by arranging the individual LED chips on the support substrate 71, electrically connecting the individual LED chips to one another, forming the wavelength converting layer 50 and then partitioning the wavelength converting layer 50 together with the support substrate 71 for each unit.

Figure 9:
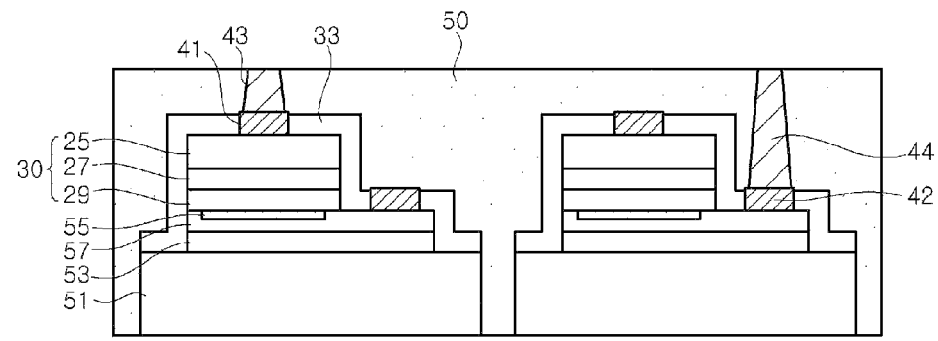
FIG. 9 is a sectional view illustrating a light emitting device according to still another embodiment of the present invention.

FIG. 9 is a sectional view illustrating a light emitting device according to still another embodiment of the present invention.

Referring to FIG. 9, the light emitting device according to this embodiment is almost similar to that of FIG. 8, but different in that the support substrate 71 is removed. The support substrate 71 may be removed after the wavelength converting layer 50 is formed as described in FIG. 8. Then, the light emitting device may be completed by partitioning the wavelength converting layer 50 for each unit. Accordingly, a bottom surface of a substrate 51 in each of the LED chips may be exposed to the outside.

In the embodiment of FIG. 8, the support substrate 71 maintains a spatial relation of the LED chips C1, C2, C3 and C4. However, in this embodiment, the wavelength converting layer 50 maintains a spatial relation of the LED chips.

Meanwhile, in this embodiment, the support substrate 71 is removed, so that the bonding pattern cannot also be used. Thus, the LED chips C1, C2, C3 and C4 are electrically connected to one another by means of connectors such as bonding wires.

Figure 10:
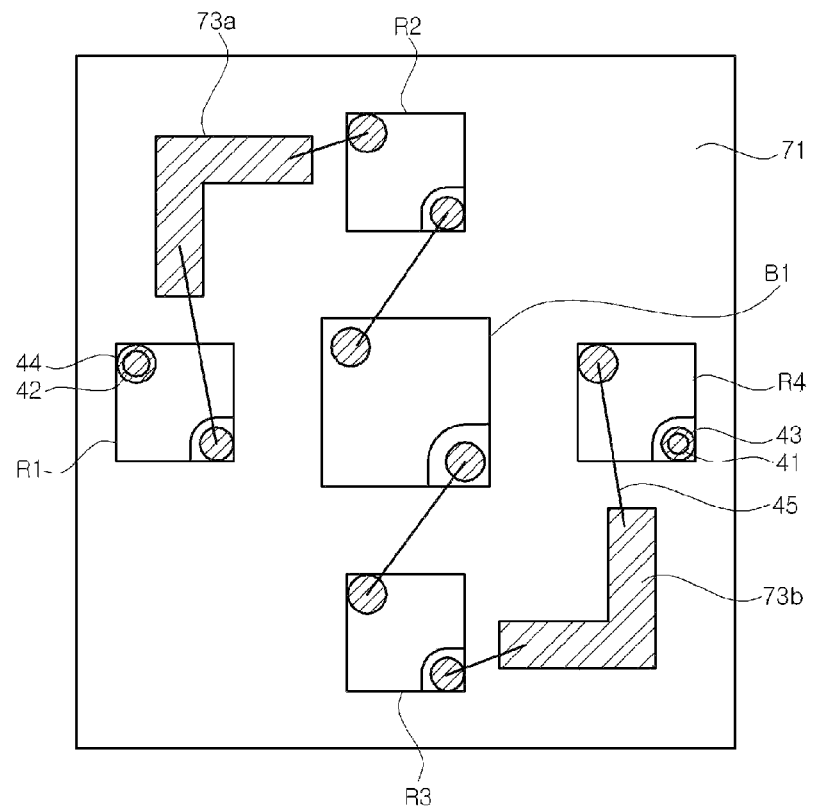
FIG. 10 is a schematic plan view illustrating a light emitting device according to still another embodiment of the present invention.
Figure 11:
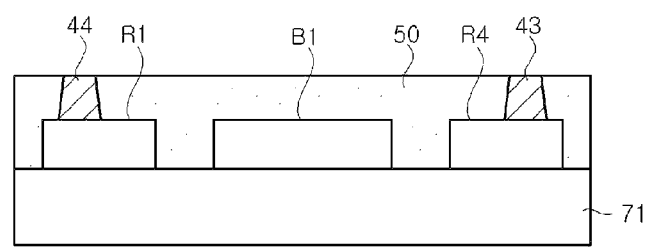
FIG. 11 is a sectional view illustrating the light emitting device of FIG. 10.

FIG. 10 is a schematic plan view illustrating a light emitting device according to still another embodiment of the present invention. FIG. 11 is a schematic sectional view illustrating the light emitting device of FIG. 10. Although the light emitting device comprising the plurality of GaN-based semiconductor stacked structures 30 has been described in the aforementioned embodiments, the light emitting device comprising an LED chip B1 for emitting light of a first wavelength and LED chips R1 to R4 for emitting light of a second wavelength will be described in this embodiment.

Referring to FIGS. 10 and 11, the light emitting device according to this embodiment comprises a support substrate 71, an LED chip B1 for emitting light of a first wavelength, and LED chips R1 to R4 for emitting light of a second wavelength. Bonding patterns 73a and 73b may be formed on the support substrate 71.

The LED chip B1 may be formed of a GaN-based semiconductor as described above, and may be an LED chip as described with reference to FIG. 6 or 8. Meanwhile, the LED chips R1 to R4 may be formed of an AlGaInP-based semiconductor. However, the present invention is not limited thereto, and the LED chips R1 to R4 may also be formed of another GaN-based semiconductor emitting light of a relatively long wavelength.

The LED chips B1 and R1 to R4 may be electrically connected to one another by means of connectors, e.g., bonding patterns 73a and 73b and bonding wires 45. First and second electrodes 41 and 42 may be provided to each of the LED chips. A first additional electrode 43 may be positioned on the first electrode 41 of one LED chip R4 so as to form a current output terminal from the light emitting device, and a second additional electrode 44 may be formed on the second electrode 42 of another LED chip R1 so as to form a current input terminal to the light emitting device.

Meanwhile, a wavelength converting layer 50 covers the LED chips B1 and R1 to R4, and the first and second additional electrodes 43 and 44 pass through the wavelength converting layer 50 to be exposed to the outside.

According to this embodiment, warm white light can be implemented, for example, by a combination of the LED chip B1 for emitting blue light, the LED chips R1 to R4 for emitting red light and the wavelength converting layer 50.

Figure 12:
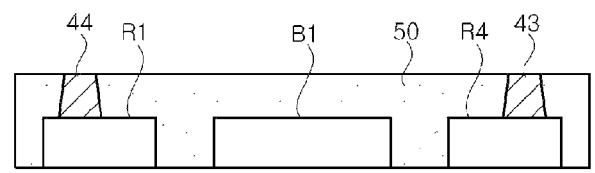
FIG. 12 is a sectional view illustrating a light emitting device according to still another embodiment of the present invention.

FIG. 12 is a sectional view illustrating a light emitting device according to still another embodiment of the present invention.

Referring to FIG. 12, the light emitting device according to this embodiment is almost similar to that described with reference to FIG. 11, but different in that the support substrate 71 is removed. Thus, a spatial relation of the LED chips B1 and R1 to R4 is maintained by the wavelength converting layer 50. Since the bonding pads 73a and 73b cannot also be used on the support substrate 71, the LED chips B1 and R1 to R4 are electrically connected to one another by connectors such as bonding wires.

Figure 13:
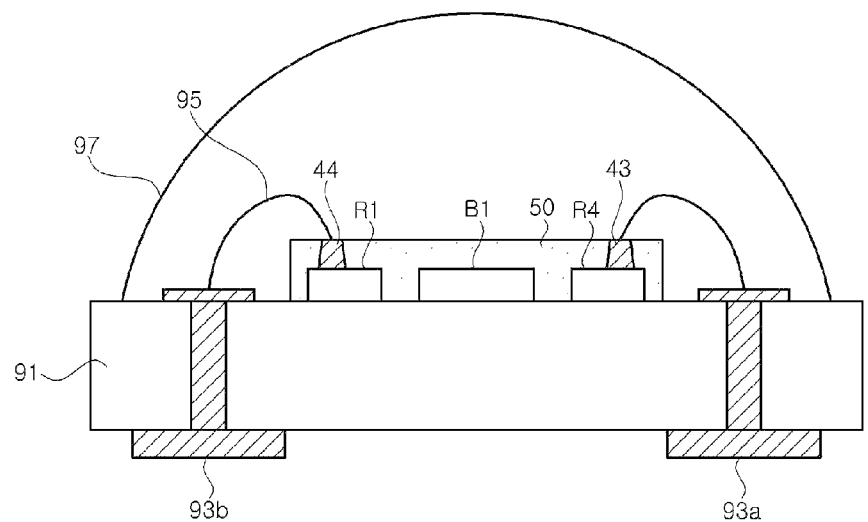
FIG. 13 is a sectional view illustrating an LED package in which a light emitting device of the present invention is mounted.

FIG. 13 is a sectional view illustrating an LED package in which a light emitting device of the present invention is mounted. Although the package having the light emitting device of FIG. 12 mounted therein is described in FIG. 13, the present invention is not limited thereto, and the package may have various types of light emitting devices as described above mounted therein.

Referring to FIG. 13, the LED package comprises a mount 91 for having the light emitting device mounted thereon. The LED package may also comprise bonding wires 95 and a lens 97.

The mount 91 may be, for example, a printed circuit board, a lead frame, a ceramic substrate, or the like, and may comprise lead terminals 93a and 93b. The first and second additional electrodes 43 and 44 of the light emitting device as described in FIG. 12 are electrically connected to the lead terminals 93a and 93b by means of the bonding wires 95, respectively.

Meanwhile, the lens 97 may cover the light emitting device. The lens 97 allows an orientation angle of light emitted from the LED chips B1 and R1 to R4 to be controlled, so that the light may be emitted in a desired direction. Since a wavelength converting layer 50 is formed in the light emitting device, the lens 97 does not necessarily contain a phosphor.

Although the LED package having the light emitting device of FIG. 12 mounted therein has been described in this embodiment, the present invention is not limited to the light emitting device of FIG. 12, and the various types of light emitting devices as described above may be mounted in the LED package.

Figure 14:
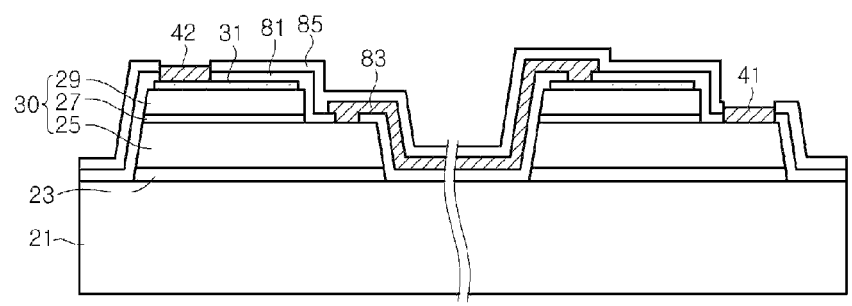
FIG. 14 is a sectional view illustrating an LED chip having a plurality of light emitting cells according to the present invention.

FIG. 14 is a sectional view illustrating an LED chip having a plurality of light emitting cells, which may be applied to a light emitting device of the present invention.

Referring to FIG. 14, although it has been illustrated and described in the aforementioned embodiments, e.g., in the embodiment of FIG. 6 that each of the LED chips is formed of the single semiconductor stacked structure 30, the present invention is not limited thereto, and an LED chip having a plurality of light emitting cells may be used. That is, an LED chip having the semiconductor stacked structure 30 formed of a plurality of light emitting cells may also be applied to the present invention.

The plurality of light emitting cells are positioned on a substrate 21, and may be electrically connected to one another by wires 83. The wires 83 may connect a first conductive-type semiconductor layer 25 of one light emitting cell to a second conductive-type semiconductor layer 29 of another light emitting cell adjacent to the one light emitting cell so as to form a serial array, and such serial arrays may be connected in parallel or reverse parallel.

An insulating layer 81 may be interposed between the light emitting cell and the wire 83 so as to prevent the first and second conductive-type semiconductor layers 25 and 29 of the light emitting cells from being short-circuited by the wire 83. A transparent conductive layer 31 is positioned between the insulating layer 81 and each of the light emitting cells. The transparent conductive layer 31 is ohmic-contacted with the second conductive-type semiconductor layer 29.

The insulating layer 81 may cover the transparent conductive layer 31, and may further cover sides of the light emitting cell. A second insulating layer 85 may cover the light emitting cells and the wires 83 so as to protect the light emitting cells and the wires 83.

Meanwhile, first and second electrodes 41 and 42 may be positioned on the light emitting cells different from each other, respectively. In this embodiment, the positions on which the first and second electrodes 41 and 42 are formed are not particularly limited. For example, all the first and second electrodes 41 and 42 may be formed on the substrate 21, or alternatively, formed on the first conductive-type semiconductor layer 25 or the second conductive-type semiconductor layer 29. The first and second electrodes 41 and 42 are exposed to the outside through the insulating layers 81 and 85, and an additional electrode may be formed on one of the first and second electrodes 41 and 42.

Although it has been described in this embodiment that the individual LED chip has a plurality of light emitting cells, the present invention is not limited thereto. For example, each of the semiconductor stacked structures 30 in the embodiments of FIGS. 2 and 3 may comprise a plurality of light emitting cells. In the embodiments of FIGS. 10 to 13, the LED chip B1 may be an LED chip having a plurality of light emitting cells. In the embodiments of FIGS. 10 to 13, some LED chips each having a single semiconductor stacked structure 30 and the other LED chips each having a plurality of light emitting cells may be used together.

Figure 15:
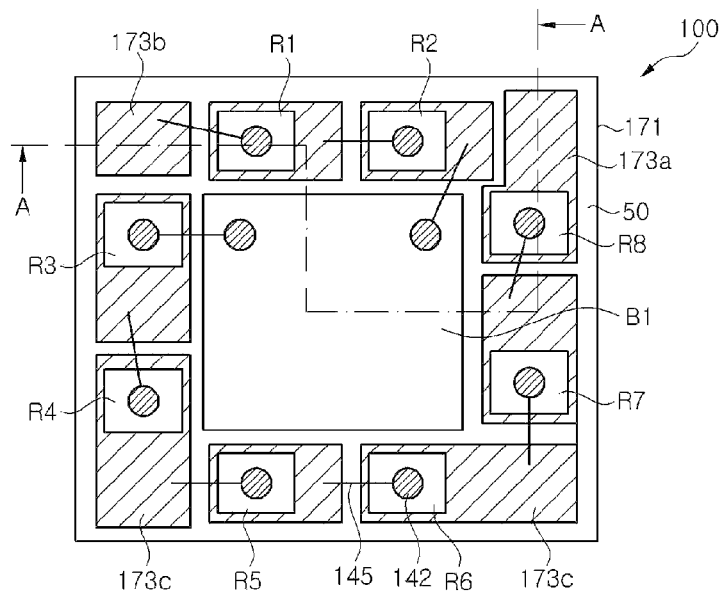
FIG. 15 is a schematic plan view illustrating a light emitting device according to still another embodiment of the present invention.
Figure 16:
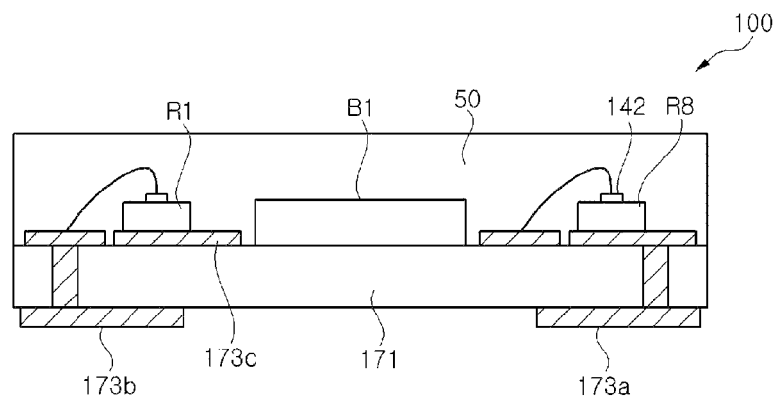
FIG. 16 is a sectional view taken along line A-A of FIG. 15.

FIG. 15 is a schematic plan view illustrating a light emitting device according to still another embodiment of the present invention. FIG. 16 is a sectional view taken along line A-A of FIG. 15.

Referring to FIGS. 15 and 16, the light emitting device 100 according to this embodiment is almost similar to those described with reference to FIGS. 10 and 11, but different in that lead electrodes 173a and 173b passing through a support substrate 171 are formed in place of the additional electrodes 43 and 44 pass through the wavelength converting layer 50 to be exposed to the outside.

That is, the light emitting device 100 comprises a support substrate 171, and bonding patterns 173c are positioned on the support substrate 171. First and second lead electrodes 173a and 173b extend from a top surface of the support substrate 171 to a bottom surface of the support substrate

171. The support substrate 171 is not particularly limited, and may be, for example, a silicon substrate, a ceramic substrate, a metal substrate or a glass substrate. When the support substrate 171 is a conductive substrate such as a metal substrate, an insulating layer may be formed on a surface of the support substrate 171.

As described with reference to FIGS. 10 and 11, the light emitting device 100 may also comprise an LED chip B1 for emitting light of a first wavelength and LED chips R1 to R8 for emitting light of a second wavelength. Here, it has been illustrated and described that the LED chips R1 to R8 for emitting the light of the second wavelength have a vertical structure. However, the LED chips R1 to R8 may have a horizontal structure as described above. Although it has been illustrated and described that the LED chip B1 for emitting the light of the first wavelength has a horizontal structure, the LED chip B1 may have a vertical structure.

The LED chip B1 for emitting the light of the first wavelength and the LED chips R1 to R8 for emitting the light of the second wavelength are electrically connected to one another by means of connectors between the first and second lead electrodes 173a and 173b.

As shown in these figures, when the LED chips R1 to R8 for emitting the light of the second wavelength have a vertical structure, each of the LED chips R1 to R8 is mounted on the bonding pattern 173c through a conductive adhesive, and is electrically connected to a neighboring bonding pattern 173 or the LED chip B1 for emitting the light of the first wavelength by means of a bonding wire 145. An upper electrode 142 may be formed on each of the LED chips R1 to R8 so as to be connected to the bonding wire 145, and first and second electrodes may be formed on the LED chip B1. When the LED chips R1 and R8 for emitting the light of the second wavelength have a horizontal structure, the chips may be electrically connected to one another using two bonding wires as described with reference to FIGS. 10 and 11. When the LED chip B1 for emitting the light of the first wavelength has a vertical structure, the LED chip B1 is mounted on a bonding pattern (not shown), and the first electrode of the LED chip B1 is electrically connected to a neighboring bonding pattern or any one of the LED chips R1 to R8 by means of a bonding wire (not shown). The second electrode of the LED chip B1 is electrically connected to a neighboring bonding pattern or any one of LED chips R1 to R8 from the bonding pattern by means of a wire (not shown). However, the present invention is not limited thereto. That is, the LED chip B1 is mounted on the bonding pattern, and may be electrically connected to any one of the LED chips R1 to R8 by means of a connector in the inside of the support substrate 171.

In this embodiment, current is introduced into the second lead electrode 173b and then flows to the LED chip B1 via the LED chips R1 and R2. Subsequently, the current sequentially flows from the LED chip R3 to the LED chip R8 and then flows out through the first lead electrode 173a.

Although it has been illustrated in this embodiment that all the LED chips B1 and R1 to R8 on the support substrate 171 are connected in series to one another, the present invention is not limited thereto, and various electrical connections are possible.

Meanwhile, the wavelength converting layer 50 covers the LED chips B1 and R1 to R8.

According to this embodiment, warm white light can be implemented, for example, by a combination of the LED chip B1 for emitting blue light, the LED chips R1 to R8 for emitting red light and the wavelength converting layer 50. The first and second lead electrodes 173a and 173b passing through the support substrate 171 are employed, so that it is unnecessary to form any additional electrode passing through the wavelength converting layer 50, unlike the aforementioned embodiments. Thus, the fabricating process of the light emitting device can be more simplified.

Although it has been described in this embodiment that the LED chip B1 for emitting the light of the first wavelength and the LED chips R1 to R8 for emitting the light of the second wavelength are positioned on the support substrate 171 in the single wavelength converting layer 50, a plurality of LED chips for emitting light of the same wavelength, e.g., a plurality of LED chips for emitting blue light, may be positioned on the support substrate 171.

Figure 17:
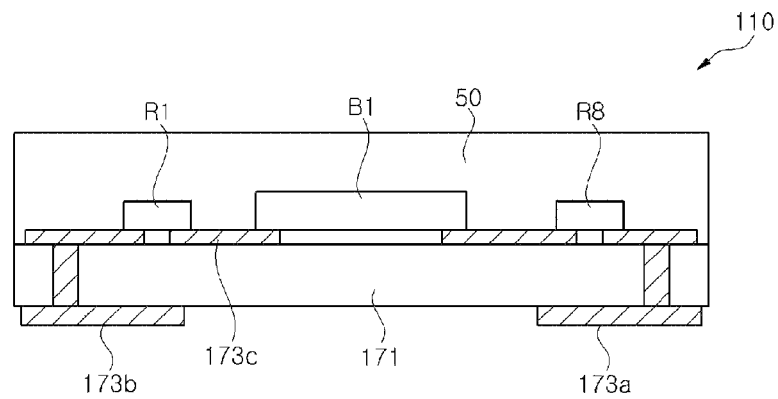
FIG. 17 is a schematic sectional view illustrating a light emitting device according to still another embodiment of the present invention.

FIG. 17 is a schematic sectional view illustrating a light emitting device 110 according to still another embodiment of the present invention.

Referring to FIG. 17, the light emitting device 110 according to this embodiment is similar to the light emitting device 100 described with reference to FIG. 16, but different in that the LED chips B1 and R1 to R8 are flip-bonded onto the bonding patterns 173c and the lead electrodes 173a and 173b on the support substrate 171.

That is, the LED chips B1 and R1 to R8 are flip-bonded onto the bonding patterns 173c between the first and second lead electrodes 173a and 173b so as to be electrically connected to one another.

According to this embodiment, the bonding wires 145 can be omitted, thereby simplifying the fabricating process of the light emitting device. Further, the heat dissipation efficiency of the light emitting device can be improved using flip chips.

Figure 18:
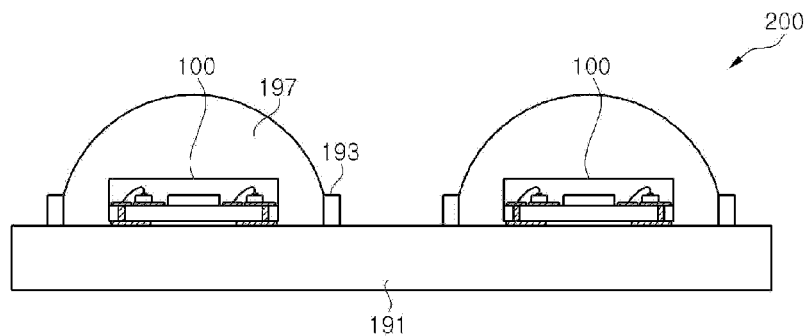
FIG. 18 is a schematic sectional view illustrating a light emitting module having a light emitting device mounted therein according to an embodiment of the present invention.

FIG. 18 is a schematic sectional view illustrating a light emitting module 200 having a light emitting device 100 mounted therein according to an embodiment of the present invention.

Referring to FIG. 18, the light emitting module 200 comprises a printed circuit board 191, the light emitting device 100, a molding portion 197 and a dam portion 193. The printed circuit board 191 may be formed of various types of PCBs such as a metal core PCB.

Meanwhile, the light emitting device 100 is identical to that described with reference to FIGS. 15 and 16. In the light emitting device 100, a plurality of LED chips B1 and R1 to R8 are mounted on a support substrate 171, and covered with a signal wavelength converting layer 50.

A plurality of light emitting devices 100 may be mounted on the printed circuit board 191. The light emitting devices 100 may be electrically connected to one another by a conductive pattern (not shown) on the printed circuit board.

Each of the light emitting devices 100 may be encapsulated by the molding portion 197, and the dam portion 193 may be formed to confine a region for forming the molding portion 197 therein.

Although it has been described in this embodiment that the light emitting devices 100 are mounted on the printed circuit board, the present invention is not limited thereto. That is, the light emitting device 110 of FIG. 17 may be mounted on the printed circuit board, or the various light emitting devices as described above may be mounted on the printed circuit board 191.

Figure 19:
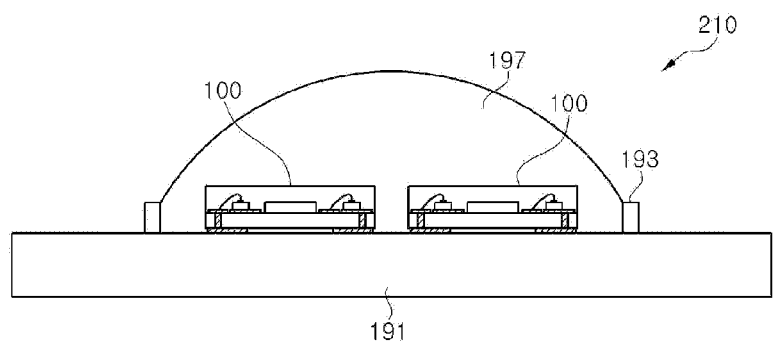
FIG. 19 is a schematic sectional view illustrating a light emitting module having a light emitting device mounted therein according to another embodiment of the present invention.

FIG. 19 is a schematic sectional view illustrating a light emitting module 210 having the light emitting device 100 mounted therein according to another embodiment of the present invention.

Referring to FIG. 19, the light emitting module 210 according to this embodiment is similar to the light emitting module 200 described with reference to FIG. 18, but different in that a plurality of light emitting devices 100 are encapsulated by one molding portion 197.

That is, the plurality of light emitting devices 100 are mounted in a region surrounded by the dam portion 193, and the molding portion 197 is formed on the light emitting devices 100 so as to surround the light emitting devices 100.

Figure 20:
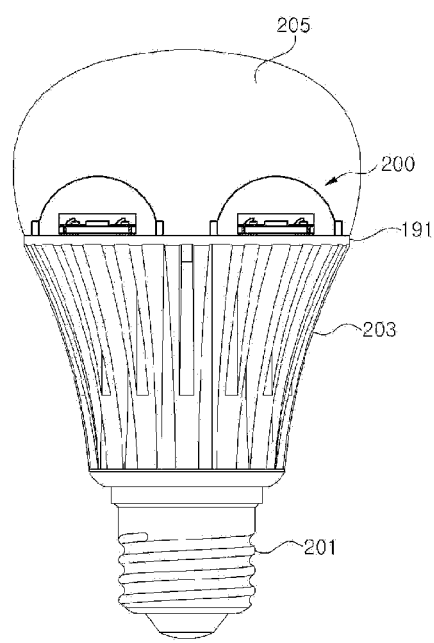
FIG. 20 is a schematic sectional view illustrating a lighting assembly having a light emitting module mounted therein according to an embodiment of the present invention.

FIG. 20 is a schematic sectional view illustrating a lighting assembly having the light emitting module 200 mounted therein according to an embodiment of the present invention. Here, a bulb-type lighting assembly will be described below.

Referring to FIG. 20, the lighting assembly comprises the light emitting module 200, a base 201, a heat sink 203 and a cover 205. The light emitting module 200 has been previously described with reference to FIG. 18, and therefore, its detailed description will be omitted.

The base 201 has terminals exposed to the outside so as to be connected to an external power source. The heat sink 203 is used to dissipate heat to the outside from the light emitting module 200, and may have a plurality of pins. The light emitting module 200 may be positioned on a top of the heat sink 203. The cover 205 covers the light emitting module 200 so as to protect the light emitting module 200 from an external environment.

In this embodiment, a bulb-type lighting assembly has been described as an example. However, the present invention is not limited thereto, and may be applied to various lighting assemblies.

Although it has been described that the light emitting module 200 is mounted in the lighting assembly, the light emitting module 210 as described with reference to FIG. 19 may be mounted in the lighting assembly.

According to this embodiment, the light emitting device having the single wavelength converting layer 50 formed on the plurality of LED chips B1 and R1 to R8 is used, so that the light emitting module can be easily fabricated, and thus the lighting assembly can be easily fabricated.

Although the present invention has been described in connection with the preferred embodiments, the embodiments of the present invention are only for illustrative purposes and should not be construed as limiting the scope of the present invention. It will be understood by those skilled in the art that various changes and modifications can be made thereto within the technical spirit and scope defined by the appended claims.

What is claimed is:

1. A light emitting device, comprising:
   semiconductor stacked structures electrically connected to one another by connectors, wherein the semiconductor stacked structures comprise a first semiconductor stacked structure and a second semiconductor stacked structure;
   a wavelength converting layer covering upper surfaces of the semiconductor stacked structures;
   first electrodes disposed on the semiconductor stacked structures, respectively;
   second electrodes disposed on the semiconductor stacked structures, respectively;
   a first additional electrode disposed only on the first electrode on the first semiconductor stacked structure;
   a second additional electrode disposed only on the second electrode on the second semiconductor stacked structure; and
   a mount comprising a first lead terminal and a second lead terminal, electrically connected to the first additional electrode and the second additional electrode, respectively,
   wherein each of the connectors electrically connects two of the semiconductor stacked structures by connecting the first electrode of one semiconductor stacked structure to the second electrode of another semiconductor stacked structure, and
   wherein the connectors are disposed under an upper surface of the wavelength converting layer.

2. The light emitting device of claim 1, wherein the wavelength converting layer has an upper surface area greater than an upper surface area of the semiconductor stacked structures.

3. The light emitting device of claim 1, wherein parts of the wavelength converting layer are disposed between the semiconductor stacked structures.

4. The light emitting device of claim 3, wherein the semiconductor stacked structures are spaced apart from each other by the wavelength converting layer.

5. The light emitting device of claim 1, further comprising a substrate disposed between the semiconductor stacked structures and the mount.

6. The light emitting device of claim 5, wherein the substrate comprises an insulation material.

7. The light emitting device of claim 5, wherein the wavelength converting layer covers a side of the substrate in a conformal thickness.

8. The light emitting device of claim 1, wherein the wavelength converting layer covers sides of the semiconductor stacked structures with a substantially uniform thickness.

9. The light emitting device of claim 8, wherein the semiconductor stacked structures are fully buried in the wavelength converting layer.

10. The light emitting device of claim 1, wherein the semiconductor stacked structures are flip chips.

11. The light emitting device of claim 1, wherein the semiconductor stacked structures are electrically connected to the first lead terminal and the second lead terminal by flip-bonding.

12. The light emitting device of claim 1, further comprising a spacer layer contacting the side surfaces of the semiconductor stacked structures.

13. The light emitting device of claim 12, wherein the spacer layer comprises an insulating layer or a distributed Bragg reflector (DBR).

* * * * *